331-98
SEARCH ROOM

July 16, 1957 J. G. STEPHENSON 2,799,778

STABLE LOCAL OSCILLATOR

Filed Jan. 11, 1956 2 Sheets-Sheet 1

INVENTOR.
JOHN G. STEPHENSON
BY Wade Koontz
S. A. Strickler
ATTORNEYS

INVENTOR.
JOHN G. STEPHENSON

BY Wade Koontz
S. A. Strickler
ATTORNEYS

United States Patent Office 2,799,778

Patented July 16, 1957

2,799,778

STABLE LOCAL OSCILLATOR

John Gregg Stephenson, Huntington, N. Y., assignor to the United States of America as represented by the Secretary of the Air Force Application January 11, 1956, Serial No. 558,598

7 Claims. (Cl. 250—36)

This invention relates to a stable local oscillator and particularly to a tunable oscillator operable to produce a generated frequency in the S-band region having maximum stability of a generated frequency.

To secure optimum utilization of high frequency electronic devices such as Moving Target Indicator (MTI) radars a very stable local oscillator frequency is needed and short term (pulse to pulse) frequency variations must be kept down to a few cycles per second per second. Further to avoid ECM the oscillator frequency must be rapidly adjustable over a relatively wide band with a desirable narrow band width.

It has heretofore been proposed to provide a local frequency generator of the type employing coaxial grid plate and grid cathode cavities coupled by a triode discharge device as exemplified by Hulstede Patent No. 2,508,573. It has further been proposed to provide movable tuning members in each of the coaxial cavities and to simultaneously proportionately shift the tuning elements to vary the output frequency.

Considerable difficulty has been encountered with the tunable cavity devices because of instability or drifting of the generated frequency. This makes MTI operation impossible.

The construction and operation of the cavity oscillator of the present invention increases the frequency stability over heretofore known oscillators of this type. The oscillator is physically strong and rugged to minimize mechanical deflection under conditions of extreme pressures, vibration and the like. All power leads entering the device are provided with good decoupling, so that movement of the leads causes no measurable reaction on the generated frequency. An extremely light load coupling is made to the plate-grid tank circuit whereby load changes have little or no effect on the generated frequency. Incremental tuning is accomplished by a tuning slug in the grid-plate line and a quarter-wave choke in the grid-cathode line. The tuning elements are mounted and carried in noncontacting relation in the cavities by adjusting members which in turn are driven by a proportional drive having counterpressures and close fits to reduce backlash to a minimum, the whole being supported in a vibration isolating mounting so that shock or vibrations from the surroundings are substantially damped out. The oscillator then uses a high order mode 5 quarter wavelength) in the grid-plate coaxial line resulting in greatly increased operating Q and consequent better frequency stability.

A drive for the tuning slug and the quarter-wave choke comprises a first and second cam mounted on the same shaft to provide simultaneously driving contact with a push rod carrying the tuning slug and a support rod carrying the quarter-wave choke to provide the desired coordination of movement.

The plate connection is provided by a plate connector mounted on the end of the central member by means of a suitable capacitor insulator.

The plate connector extends axially through the plate capacitor insulator connection and substantially axially through the central member and the push rod to a point near the termination of the tunable cavity.

A suitable quarter-wave choke is preferably provided in the push rod to prevent coupling of R. F. energy down the push rod to or from the outside of the oscillator, thus isolating the frequency generating portion of the oscillator from the suroundings. A suitable finger plunger is provided in the grid plate cavity for controlling the frequency of the center line of the oscillator.

It is accordingly an object of the invention to provide an improved oscillator having extremely good short-term stability.

It is another object of the invention to provide a cavity oscillator having tuning elements in noncontacting relation in the cavities.

It is a further object of the invention to provide a local oscillator stable at any selected frequency over the S-band range.

It is still another object of the invention to provide a tuning drive for simultaneously tuning, in proper proportion, the resonant cavities of a local oscillator to maintain sharp tuning while varying the frequency over the wave band range.

It is still a further object of the invention to provide improved connections between an electron device and a cavity oscillator therefor.

Other objects and advantages of the invention will be readily apparent from the following detailed description taken in conjunction with the acompanying drawings in which.

Figure 1:
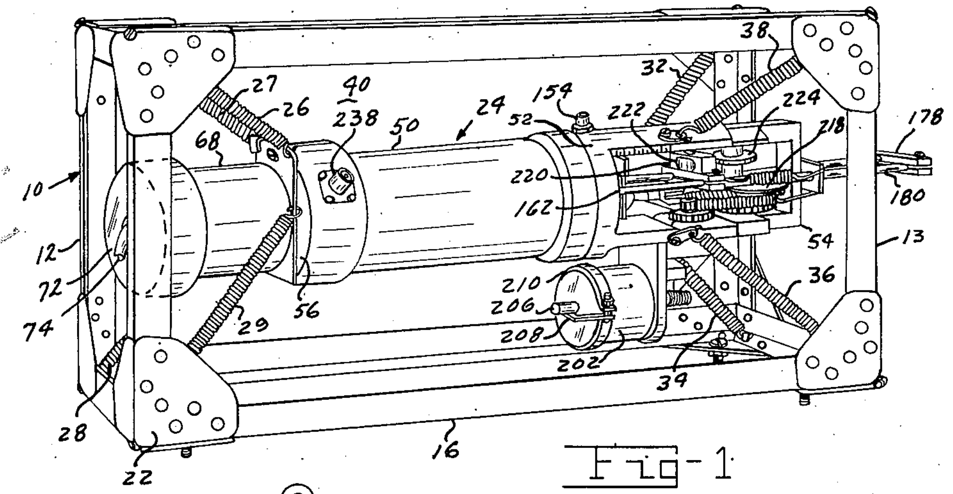
Figure 1 is a perspective view of an oscillator and mount according to the invention.
Figure 6:
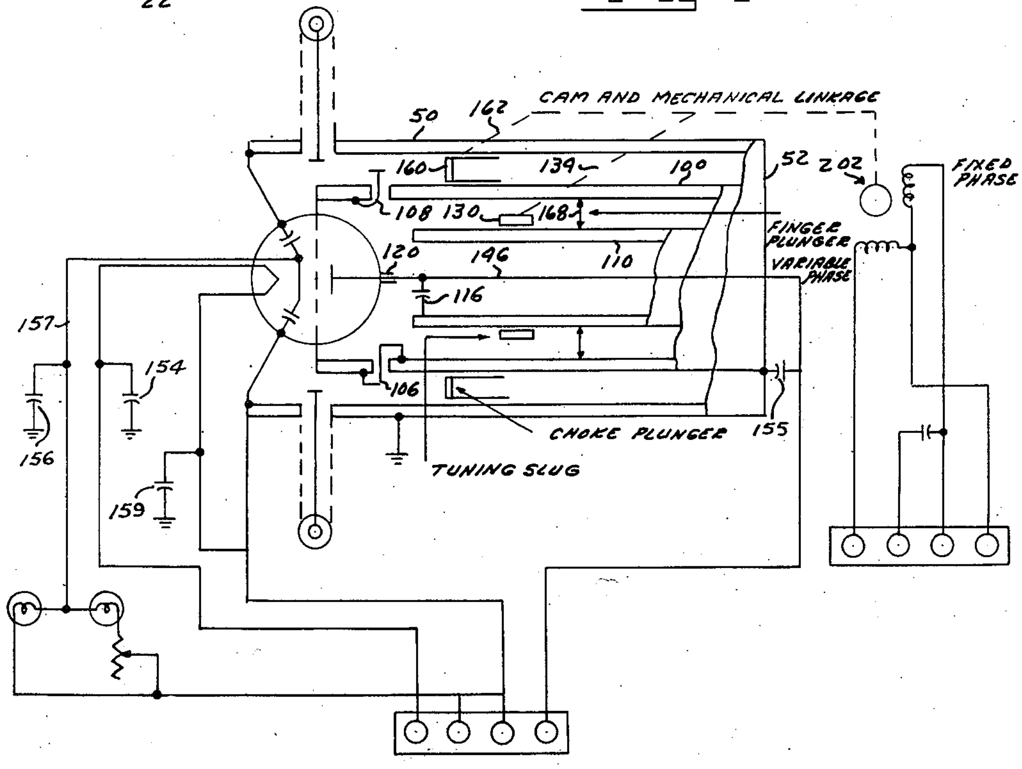
Fig. 6 is a schematic illustration of the oscillator according to the invention.
Figure 2:
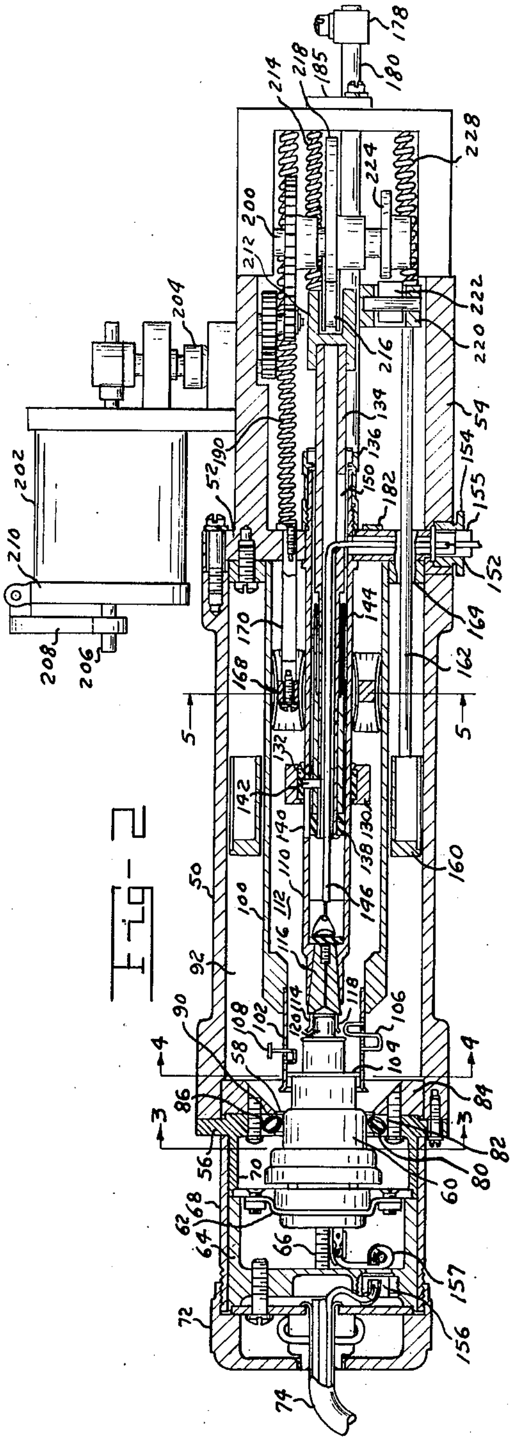
Fig. 2 is a sectional elevation through the oscillator.
Figure 4:
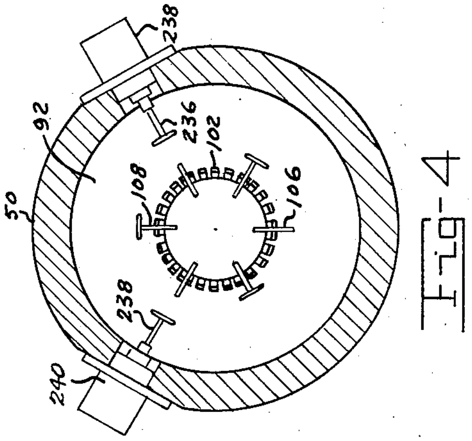
Fig. 4 is a cross section taken substantially on the plane indicated by the section line 4—4 of Figure 2.
Figure 5:
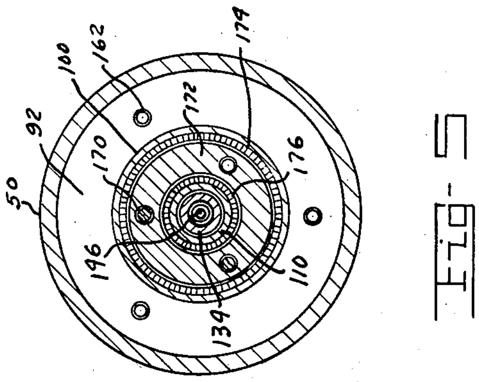
Fig. 5 is a cross section taken substantially in the section line 5—5 of Figure 2.
Figure 3:
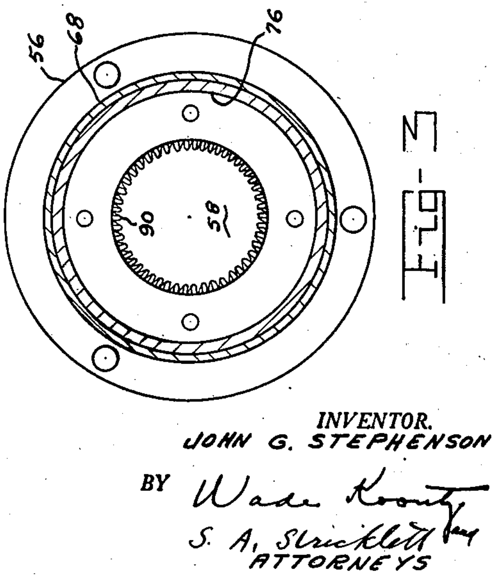
Fig. 3 is a cross section through the oscillator taken substantially on the plane indicated by the section line 3—3 of Fig. 2.

In an exemplary embodiment according to the invention, a supporting frame, indicated generally at 10, is substantially rectangular in cross section and has end frames 12 and 13 rigidly supported in spaced relation by suitable reach members 16. The frame is preferably rigidified and reinforced at each corner by suitable gusset plates 22. An oscillator device 24 is supported in an intermediate position in the frame 10 by means of opposed tension members such as the coil springs 26—36 which damp out external shock and vibration.

The oscillator comprises an outer tubular casing 50 sufficiently strong and rugged to minimize mechanical distortion and having a rear end 52 on which is mounted a frame member 54 for supporting a suitable drive mechanism presently to be described.

The opposite or forward end of the tubular member 50 is closed by an end member 56 having an aperture 58 for receiving the cathode end of a triode electron discharge device herein shown as a lighthouse type triode 60. A tube holder includes a base member 62 adapted to receive the electron device 60 and mounted on a receiving frame 64 by means of suitable fasteners such as the bolts 66. The frame 64 is mounted on a tubular extension 68 secured on a seat 70 preferably integral with the end member 56 by means of a screw cap 72 through which extends a suitable lead cable 74. The end 56 is provided with an offset portion 80 providing a recessed shoulder 82 and has a ring 84 spaced from the offset portion 80 to provide an annular seat 86 in the wall of the aperture 58 in the end member 56. A spiral spring member 90 is mounted in the seat 86 and extends inwardly so as to be intercepted by a triode 60 extending through the aperture 58. The insertion of the triode 60 through the aperture 58 flexes or distorts the spring 90 so that the spring 90 maintains good electrical contact between the cathode housing of the triode 60 and the outer wall 50 of the resonant cavity 92.

An inner tubular member 100 is concentric with and spaced from the outer tubular member 50 to provide a substantially annular grid cathode cavity 92 with the inner end of the member 100 having resilient fingers 102 for flexing into firm engagement with the grid plate 104 of the lighthouse triode 60. A central member 110 extends axially within the member 100 to provide an annular plate-grid cavity 112 coaxial with and extending within the grid-cathode cavity 92. Feedback connections such as the S-type connection 106 and the J-type connection 108 are provided between the cavity 92 and the cavity 112.

A plate terminal engaging device 114 is mounted on the end of the central member 110 by means of a capacitor insulator 116. Preferably the capacitor insulator 116 is of the mica insulator type. The terminal connector 114 is provided with resilient spring fingers 118 for engagement with the plate terminal 120 of the lighthouse type triode 60.

A hollow push rod 134 is slidably mounted in the interior of the central member 110 by means of a guide bushing 136 and insulated bearing bushing 138. The central tubular member 110 is provided with a longitudinally extending slot 140 through which extends a connector pin 142 rigidly secured to the push rod 144. An annular tuning slug 130 is mounted on the pin 142 by means of an insulating bushing 132 and moves in noncontacting relation in the plate grid cavity 112. The push rod 134 is provided adjacent to the central portion thereof with a quarter-wave choke 144 to prevent coupling of R. F. energy down the push rod 134 between inside and outside of the oscillator thus isolating the frequency generating portion of the oscillator from the surroundings.

The push rod 134 is provided with an axial bore through which extends a conductor 146 which is connected to the plate terminal connector 114 and is further provided at a point adjacent the end 152 with a slot 150 through which the conductor 146 is extended by means of a coaxial conductor 152 to an outside coupling 154 which includes a decoupling by-pass capacitor 155. Further decoupling is obtained by the utilization of by-pass capacitor 156 between the cathode lead 157 and the frame 64 and the by-pass capacitors 158 and 159 for the filament leads.

A quarter-wave choke 160 is supported in noncontacting relation in the grid cathode cavity 92 by means of support rods 162 which extend through guide apertures 164 in end plate 52. A finger plunger 168 is mounted in conducting relation in the grid plate cavity 112 by means of control rods 170.

A very light load connection is made to the cavity 92 by the probes 234 and 236 supported by the coaxial couplings 238 and 240 mounted on the member 50.

The finger plunger 168 comprises a substantially annular core member 172 having an outer sleeve 174 and an inner sleeve 176. The inner and outer sleeves 174 and 176 are slotted adjacent the extremities thereof and flared outwardly from the core member 172 to provide resilient contact with the inner surface of the member 100 and the outer surface of the member 110 so that the finger plunger 168 effectively short circuits the cavity 112 to control the effective length thereof. The position of the finger plunger 168 mounted on the control rods 170 is controlled by means of a manual control handle 178 which is connected by means of rods 180 to a collar 182 to which is secured the control rods 170. A resilient member such as the coil spring 190 resiliently urges the collar 182 to a retracted position and any suitable device 185 may be utilized to lock the rods 180 in the desired position.

The driving mechanism for the push rod 134 and the support rod 162 comprises a shaft 200 driven by a motor 202 through a chain of gearing 204. Preferably the chain of gearing 204 includes a non-reversible worm drive so that the shaft 200 will be rotated only in response to the motor 202. The motor 202 is provided with a brake shaft 206 which is engaged by a brake lever 208 mounted on a supporting band 210.

A mounting collar 212 is fixed on the outer end of the push rod 134 and is resiliently urged to the withdrawn position by means of a resilient device such as the coil spring 214. A cam follower or wheel 216 is journaled on the collar 212 for engagement with a first actuator cam 218 mounted on the shaft 200. A drive member 220 is fixed on the outer end of the support shaft 162 and carries a cam follower roller 222 for engagement with a second actuator cam 224 mounted on the shaft 200.

The supporting shafts 162 are urged to outer position by means of a tension member such as the coil spring 228.

In the utilization of the oscillator according to the invention a lighthouse triode such as 60 is mounted on the base 62 in the holder 64 and extends inwardly into the end of the oscillating cavity until the plate terminal 120 is engaged in the terminal connection 114, the grid terminal 104 is engaged in the fingers 102 and the cathode chamber deforms or deflects the spiral spring 90 to provide good electrical contact between the cathode chamber and the outer cavity wall 50, good electrical connection between the grid plate 104 and the member 100 and firm contact between the plate terminal 120 and the conductor 146. The finger plunger 168 is moved to any desired position in the cavity 112 and the motor 202 is energized to move shaft 200 which by means of the cams 218 and 224 moves the tuning slug 130 and the quarter-wave choke 160 in a desired proportionate amount to simultaneously maintain the tuning of both the cavity 92 and the cavity 112.

For purposes of exemplification a particular embodiment of the invention has been shown and described according to the best present understanding thereof. However, it will be apparent to those skilled in the art that various changes and modifications in the construction and arrangement of the parts thereof may be readily resorted to without departing from the true spirit and scope of the invention.

I claim:

1. An oscillator comprising a grid plate cavity, a grid cathode cavity coaxial with said grid plate cavity, a holder adapted to mount a triode between said cavities, a feedback connection between said cavities, a tubular center member extending axially of said grid plate cavity, a push rod slidably mounted in said center member, a plate connection extending axially of said center member, a capacitive mounting between said plate connection and said center member, a tuning slug slidable in noncontacting relation in said grid plate cavity, said central member having a longitudinal slot therein adjacent to the path of travel of said tuning slug, means extending through said slot securing said tuning slug to said push rod, and a quarter-wave choke mounted in said push rod.

2. An oscillator comprising a grid plate cavity, a grid cathode cavity coaxial with said grid plate cavity, a holder adapted to mount a triode between said cavities, a tubular center member extending axially of said grid plate cavity, a push rod slidably mounted in said center member, a plate connection extending axially of said center member, a capacitive mounting between said plate connection and said center member, a tuning slug slidable in said grid plate cavity, said central member having a longitudinal slot therein adjacent to the path of travel of said tuning slug, means extending through said slot securing said tuning slug to said push rod, a quarter-wave choke in said push rod and a finger plunger slidably mounted in said grid plate cavity.

3. An oscillator comprising a grid plate cavity, a grid cathode cavity coaxial with and surrounding said grid plate cavity, an electron device mounted in interconnecting relation between said cavities, a tubular center member extending axially in said grid plate cavity, a tuning slug mounted in noncontacting relation in said grid plate cavity, a push rod slidably mounted in said center member, said center member having a longitudinally extending slot therein, a driving connection between said push rod and said slug and extending through said slot.

4. An oscillator comprising a grid plate cavity, a grid cathode cavity coaxial with and surrounding said grid plate cavity, a triode electron device mounted in interconnecting relation between said cavities, a tubular center member extending axially in said grid plate cavity, a tuning slug mounted in said grid plate cavity, a push rod slidably mounted in said center member, said center member having a longitudinally extending slot therein, a driving connection between said push rod and said slug and extending through said slot, a quarter-wave choke mounted in said grid cathode cavity, a support rod operatively connected to said choke, a first cam operatively engaging said push rod, a second cam operatively engaging said support rod and means simultaneously actuating said cams.

5. An oscillator comprising a grid plate cavity, a grid cathode cavity coaxial with said grid plate cavity, a holder adapted to mount a triode between said cavities, a feedback connection between said cavities, a tubular center member extending axially of said grid plate cavity, a push rod slidably mounted in said center member, a plate connection extending axially of said center member, a capacitive mounting between said plate connection and said center member, a tuning slug in said grid plate cavity, said central member having a longitudinal slot therein adjacent to the path of travel of said tuning slug, means extending through said slot securing said tuning slug to said push rod, a quarter-wave choke in said push rod, a quarter-wave choke mounted in noncontacting relation in said grid cathode cavity, a support rod operable to position said choke in said grid cathode cavity, a first cam in engagement with said push rod, a second cam in engagement with said support rod and drive means for simultaneously actuating said cams.

6. An oscillator comprising a grid plate cavity, a grid cathode cavity coaxial with said grid plate cavity, a holder adapted to mount a triode between said cavities, an annular spring seat in the wall of said grid cathode cavity, a spiral spring mounted in said seat and adapted to engage the cathode of a triode mounted in said holder, a tubular center member in said grid plate cavity, a push rod slidably mounted in said center member, said push rod having a longitudinally extending passage therein, a plate connector, a capacitive mounting securing said plate connector on said central member, a plate conductor secured to said connector and extending into said passage, a tuning slug longitudinally movable in said grid plate cavity, said central member having a longitudinal slot therein adjacent to the path of travel of said slug coupling means extending through said slot and securing said push rod in driving relation to said slug and a quarter-wave choke mounted in said push rod, said quarter-wave choke being operative to prevent coupling along the push rod.

7. An oscillator comprising a grid-plate cavity, a grid cathode cavity coaxial with said grid-plate cavity, a holder adapted to mount a triode between said cavities, an annular spring seat in the wall of said grid cathode cavity, a spiral spring mounted in said seat and adapted to engage the cathode of a triode mounted in said holder, a tubular center member in said grid-plate cavity, a push rod slidably mounted in said center member, said push rod having a longitudinally extending passage therein, a plate connector, a capacitive mounting securing said plate connector on said central member, a plate conductor secured to said connectod and extending into said passage, a tuning slug longitudinally movable in said grid-plate cavity, said central member having a longitudinal slot therein adjacent to the path of travel of said slug coupling means extending through said slot and securing said push rod in driving relation to said slug and a quarter-wave choke mounted in said push rod, said quarter-wave choke being operative to prevent coupling along the push rod, said oscillator being characterized by a five quarter wavelength mode of operation in the grid-plate line.

References Cited in the file of this patent

UNITED STATES PATENTS

| | | |
|---|---|---|
| 2,408,927 | Gurewitsch | Oct 8, 1946 |
| 2,477,232 | Branson | July 26, 1949 |
| 2,617,038 | Russell | Nov. 4, 1952 |
| 2,678,428 | Fiet | May 11, 1954 |